(12) United States Patent
Ju et al.

(10) Patent No.: US 10,340,538 B2
(45) Date of Patent: Jul. 2, 2019

(54) PERFORMANCE TESTING APPARATUS OF FUEL CELL

(71) Applicant: Hyundai Motor Company, Seoul (KR)

(72) Inventors: HoKyun Ju, Gyeonggi-do (KR); TaeJong Kim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 436 days.

(21) Appl. No.: 15/206,620

(22) Filed: Jul. 11, 2016

(65) Prior Publication Data

US 2017/0133697 A1 May 11, 2017

(30) Foreign Application Priority Data

Nov. 9, 2015 (KR) .......................... 10-2015-0156965

(51) Int. Cl.

| | |
|---|---|
| *G01R 31/04* | (2006.01) |
| *H01M 8/04537* | (2016.01) |
| *G01R 31/374* | (2019.01) |
| *G01R 31/3835* | (2019.01) |
| *H01M 8/04082* | (2016.01) |
| *H01M 8/04701* | (2016.01) |
| *H01M 8/04313* | (2016.01) |
| *H01M 8/04664* | (2016.01) |
| *H01M 8/04007* | (2016.01) |

(52) U.S. Cl.
CPC ...... *H01M 8/04552* (2013.01); *G01R 31/374* (2019.01); *G01R 31/3835* (2019.01); *H01M 8/04201* (2013.01); *H01M 8/04313* (2013.01); *H01M 8/04664* (2013.01); *H01M 8/04701* (2013.01); *H01M 8/04007* (2013.01)

(58) Field of Classification Search
CPC ............ G01R 31/3648; G01R 31/3655; G01R 31/3675; G01R 31/02; G01R 31/04; G01R 31/36
USPC ....... 324/425, 426, 430, 432, 433, 509, 512, 324/528, 531, 541, 544
See application file for complete search history.

(56) References Cited

U.S. PATENT DOCUMENTS

| | | | | |
|---|---|---|---|---|
| 6,590,396 | B1 * | 7/2003 | Zur .................. | H02J 7/1461 |
| | | | | 324/433 |
| 2012/0182024 | A1 * | 7/2012 | Ike ................... | G01R 31/025 |
| | | | | 324/509 |
| 2013/0127473 | A1 * | 5/2013 | Ikeda .............. | H01M 10/0431 |
| | | | | 324/426 |
| 2013/0346000 | A1 * | 12/2013 | Joe .................. | H01M 10/052 |
| | | | | 702/63 |

(Continued)

FOREIGN PATENT DOCUMENTS

| | | |
|---|---|---|
| JP | 2008-108519 A | 5/2008 |
| JP | 4978469 B2 | 7/2012 |

*Primary Examiner* — Jermele M Hollington
*Assistant Examiner* — Taqi R Nasir
(74) *Attorney, Agent, or Firm* — Mintz Levin Cohn Ferris Glovsky and Popeo, P.C.; Peter F. Corless

(57) ABSTRACT

A performance testing apparatus of a fuel cell is provided. The apparatus includes a moving body that stacks at least one unit cell and is installed to be movable along a predetermined transporting path on a frame. A pressurizing unit is mounted to the frame, presses the unit cell on the moving body moved from a beginning stage side of the transporting path, and supplies a reaction fluid to the unit cell. A terminal connection part is mounted to the pressurizing unit side the frame and connects a terminal to output a voltage of the unit cell to the unit cell.

19 Claims, 6 Drawing Sheets

(56) References Cited

U.S. PATENT DOCUMENTS

| 2015/0137822 | A1* | 5/2015 | Joe | H01M 4/364 |
| | | | | 324/426 |
| 2016/0164119 | A1* | 6/2016 | Lim | H01M 8/043 |
| | | | | 429/429 |
| 2016/0365598 | A1* | 12/2016 | Ju | H01M 8/2404 |

* cited by examiner

PERFORMANCE TESTING APPARATUS OF FUEL CELL

CROSS-REFERENCE TO RELATED APPLICATION

This application claims priority to and the benefit of Korean Patent Application No. 10-2015-0156965 filed in the Korean Intellectual Property Office on Nov. 9, 2015, the entire contents of which are incorporated herein by reference.

BACKGROUND (a) Field of the Invention

The present invention relates to a performance testing apparatus of a fuel cell, and more particularly, to a performance testing apparatus of a fuel cell that enables of testing a performance while maintaining an activation state of the fuel cell.

(b) Description of the Related Art

In general, a fuel cell includes an electrode for generating an electrochemical reaction with a fuel and an oxidizer, a polymer electrolyte membrane for transferring protons generated by the reaction, and a separator (commonly called a "separation plate") for supporting the electrode and the polymer electrolyte membrane. The fuel cell includes a unit cell of an individual unit, to obtain high potential, the unit cell may be stacked by a required number of the potentials.

Further, in a manufacturing process for producing a membrane-electrode assembly including an electrode and a polymer electrolyte film of the fuel cell, a failure detection of the membrane-electrode assembly is limited to a surface testing by a vision. Therefore, before stacking the unit cells into the completion stack, an evaluation method of the performance of the unit cells is incomplete. For the performance testing of the unit cells, a reaction fluid is supplied to the unit cell, and it is necessary to maintain an activation of the unit cell, in the related art, after assembling the stack by stacking the unit cells, the activation state of the unit cells is maintained and the performance testing is executed.

The activation maintenance and the performance evaluation of the fuel cell are performed by different methods for each manufacture of the fuel cell, however the main method includes driving the unit cells during a substantial period of time under a predetermined voltage. Additionally, the activation maintenance and the performance evaluation process of the fuel cell according to the related art includes supplying the reaction fluid of the fuel and an oxidant to the unit cells of the stack and applying the electrical energy generated in the unit cells to an electronic load after manufacturing the stack of which the plurality of the unit cells are stacked and engaged. However, since the process of the activation maintenance and the performance evaluation of the fuel cell is executed after assembling the unit cells into the completion stack, this process is inefficient in aspects of cost and time.

The above information disclosed in this section is merely for enhancement of understanding of the background of the invention and therefore it may contain information that does not form the prior art that is already known in this country to a person of ordinary skill in the art.

SUMMARY

The present invention provides a performance testing apparatus of a fuel cell that evaluates the performance of the membrane-electrode assembly while maintaining the activation of the unit cell that is sampled in each lot of the manufacturing process of the fuel cell before assembling the stack.

Additionally, the present invention provides a performance testing apparatus of a fuel cell that obtains a membrane-electrode assembly quality testing reference in the manufacturing process of the fuel cell by analyzing the performance of the unit cell in conjunction with a surface defect information of the membrane-electrode assembly obtained in the fuel cell manufacturing process.

A performance testing apparatus of a fuel cell according to an exemplary embodiment of the present invention may include a moving body that stacks at least one unit cell and may be installed to be movable along a predetermined transporting path on a frame; a pressurizing unit installed to the frame, configured to press the unit cell on the moving body moved from a beginning stage side of the transporting path, and configured to supply a reaction fluid to the unit cell; and a terminal connection part attached to the pressurizing unit side the frame and that connects a terminal to output a voltage of the unit cell to the unit cell.

The performance testing apparatus may further include a controller configured to monitor an output voltage of the unit cell output through the terminal connection part and evaluate the performance of the unit cell. The controller may be configured to supply a reaction fluid to the unit cell using the pressurizing unit when the unit cell is pressed by the pressurizing unit during a predetermined period of time. The performance testing apparatus of the fuel cell may further include a reaction fluid supply part installed to be connected to the pressurizing unit and configured to supply the reaction fluid to the unit cell through the pressurizing unit.

The performance testing apparatus of the fuel cell may further include a cooling media supply part installed to be connected to the moving body and configured to supply a cooling media to the unit cell through the moving body. The frame may be divided into, based on the transporting path, a stack section as a region where the unit cell is stacked to the moving body of the beginning stage side of the transporting path, a pressure section as a region where the unit cell on the moving body moved from the stack section is pressed by the pressurizing unit, and a draw out section (e.g., extraction section) as a region where the unit cell on the moving body moved to an end stage side of the transporting path from the pressure section is extracted (e.g., drawn out).

The frame may include a first moving rail installed from the beginning stage of the transporting path to the end stage, and a second moving rail connected to the first moving rail of the beginning stage side of the transporting path to be mutually crossed. The moving body may be installed to be movable by the first driving part along the first and second moving rails. The pressurizing unit may include a press body mounted to the press frame on the frame to be movable in vertical directions and configured to press or exert pressure onto the unit cell stacked on the moving body.

The press body may be installed with a reaction fluid supply part configured to supply the reaction fluid to the unit cell to be connected. The press body may be provided as an upper end plate connected to the reaction fluid supply part and may include a manifold configured to supply and exhaust the reaction fluid for the unit cell. The moving body may include a supporting plate configured to support the unit cell. The supporting plate may be installed with a cooling media supply part configured to supply the cooling media to the unit cell to be connected. The supporting plate may be provided as a lower end plate connected to the cooling media supply part and may include a manifold configured to supply and exhaust the cooling media for the unit cell.

The press body may be installed to be connected to an operation rod of a press cylinder provided in the press frame. The press frame may be installed with a plurality of guide rods configured to support the press body to be guided in the vertical direction. The terminal connection part may be installed to be reciprocally moved by the second driving part in the direction crossing the transporting path.

Moreover, a performance testing apparatus of the fuel cell maintaining an activation of a unit cell sampled in each lot of a fuel cell manufacturing process and evaluating a performance of the unit cell according to an exemplary embodiment of the present invention may include a moving body configured to stack at least one unit cell and installed to be movable along a predetermined transporting path on a frame; a pressurizing unit installed to the frame, configured to press the unit cell on the moving body moved from a beginning stage side of the transporting path, and supply a reaction fluid to the unit cell; a terminal connection part mounted to the pressurizing unit side the frame and that connects a terminal to output a voltage of the unit cell to the unit cell; and a controller configured to monitor an output voltage of the unit cell output through the terminal connection part and evaluate the performance of the unit cell. The controller may be configured to store a performance evaluation information of the unit cell and a surface defect information of a membrane-electrode assembly obtained from the fuel cell manufacturing process, analyze the performance of the unit cell based on the information, and feedback the analysis result to the fuel cell manufacturing process.

The performance testing apparatus of the fuel cell may stack at least one unit cell on the moving body of the beginning stage side of the transporting path, move the unit cell to the pressurizing unit side using the moving body, press the unit cell using the pressurizing unit and supply the reaction fluid to the unit cell, and connect a voltage output terminal to the unit cell using the terminal connection part. The performance testing apparatus of the fuel cell may further apply the output voltage of the unit cell to the electronic load equipment using the voltage output terminal, and may monitor the output voltage of the unit cell applied to the electronic load equipment using the controller. The performance testing apparatus of the fuel cell may also release the pressure of the unit cell of the pressurizing unit and move the unit cell to the end stage side of the transporting path using the moving body.

According to exemplary embodiments of the present invention, before configuring the membrane-electrode assembly produced in each lot of the fuel cell manufacturing process as the unit cell 1 and assembling the unit cell as the stack, since the performance of the membrane-electrode assembly is sampling and tested, the time aspect and the cost aspect are more efficient, and the time and the cost may be reduced.

Furthermore, in an exemplary embodiment of the present invention, the performance of the unit cell may be analyzed in conjunction with the surface defect information of the membrane-electrode assembly obtained from the fuel cell manufacturing process and the analysis result may be fed back to the fuel cell manufacturing process to thus obtain and improve the quality testing reference of the membrane-electrode assembly in the fuel cell manufacturing process.

BRIEF DESCRIPTION OF THE DRAWINGS

The above and/or other aspects and advantages of the prevent invention will become apparent and more readily appreciated from the following description of the exemplary embodiments, taken in conjunction with the accompany drawings.

DETAILED DESCRIPTION

Figure 1:
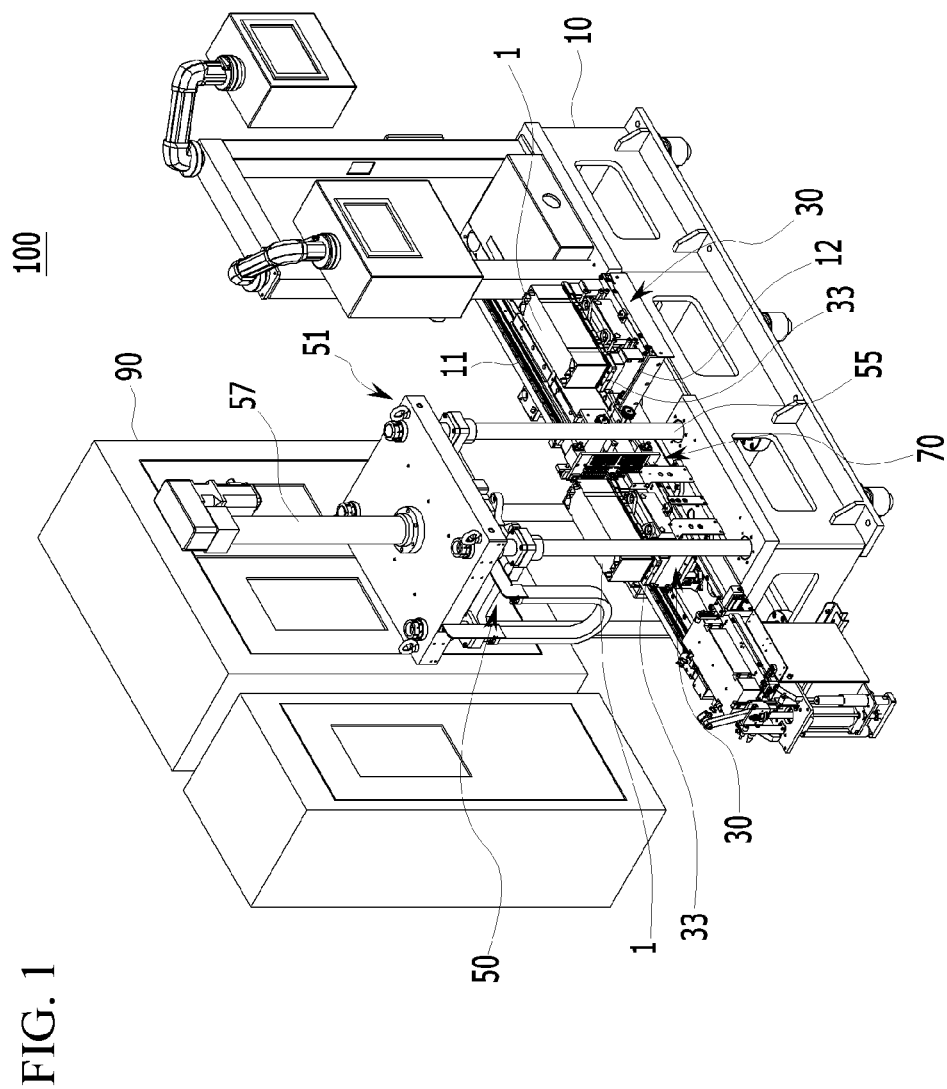
FIG. 1 is a perspective view of a performance testing apparatus of a fuel cell according to an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

The present invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the present invention.

In order to clarify the present invention, parts that are not connected with the description will be omitted, and the same elements or equivalents are referred to with the same reference numerals throughout the specification. Also, the size and thickness of each element are arbitrarily shown in the drawings, but the present invention is not necessarily limited thereto, and in the drawings, the thickness of layers, films, panels, regions, etc., are exaggerated for clarity.

Discriminating the names of components with the first, the second, etc. in the following description is for discriminating them for the same relationship of the components and the components are not limited to the order in the following description. Further, the terms, " . . . unit", " . . . mechanism", " . . . portion", " . . . member" etc. used herein mean the unit of inclusive components performing at least one or more functions or operations.

Figure 2:
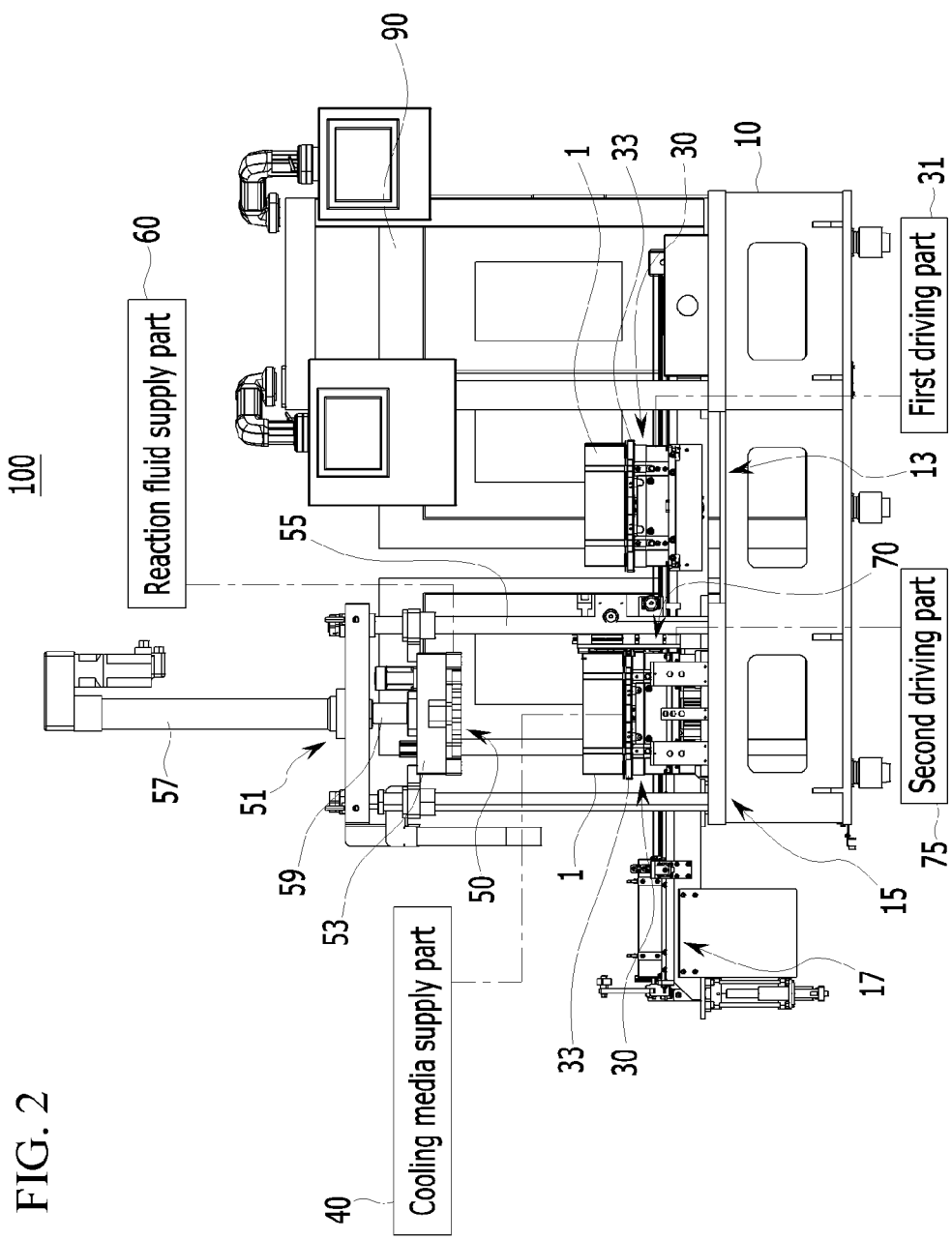
FIG. 2 is a front schematic diagram of a performance testing apparatus of a fuel cell according to an exemplary embodiment of the present invention.

FIG. 1 is a perspective view of a performance testing apparatus of a fuel cell according to an exemplary embodiment of the present invention, and FIG. 2 is a front schematic diagram of a performance testing apparatus of a fuel cell according to an exemplary embodiment of the present invention. Referring to FIG. 1 and FIG. 2, a performance testing apparatus 100 of the fuel cell according to an exemplary embodiment of the present invention may maintain an activation of a unit cell 1 and may include a membrane-electrode assembly (MEA) and a separator disposed via the membrane-electrode assembly to evaluate the performance of the unit cell 1.

The performance testing apparatus 100 of the fuel cell may test the performance of the membrane-electrode assembly disposed within the unit cell 1 by a method of supplying a fuel and an oxidant (hereinafter, referred to as "a reaction fluid") to the unit cell 1 and applying a predetermined voltage output from the unit cell 1 to an electronic load. In an exemplary embodiment of the present invention, the unit cell 1 may be configured as the membrane-electrode assembly produced in each lot of the fuel cell manufacturing process, and the unit cell 1 may be sampling-tested by an automatic process through the performance testing apparatus 100, in this case, a test series testing process may be executed separately from the fuel cell manufacturing process.

Particularly, the membrane-electrode assembly sampled in each lot of the fuel cell manufacturing process may have an individual identification (ID) and a bar code identifying the ID. The bar code stores surface defect information of the membrane-electrode assembly obtained from the fuel cell manufacturing process. The performance testing apparatus 100 of the fuel cell according to an exemplary embodiment of the present invention may maintain the activation of the unit cell 1 sampled from each lot of the fuel cell manufacturing process before assembling the stack and evaluate the performance of the membrane-electrode assembly.

Additionally, the performance testing apparatus 100 of the fuel cell according to an exemplary embodiment of the present invention may be configured to analyze the performance of the unit cell 1 in conjunction with the surface defect information of the membrane-electrode assembly obtained from the fuel cell manufacturing process to obtain a membrane-electrode assembly quality testing reference in the fuel cell manufacturing process. Accordingly, the performance testing apparatus 100 of the fuel cell according to an exemplary embodiment of the present invention may include a frame 10, a moving body 30, a pressurizing unit 50, a terminal connection part 70, and a controller 90.

The frame 10 may be configured to support various constituent elements that will be described later and may include one frame or two or more compartment frames. The frame 10 may include various accessory components to support the constituent elements such as a bracket, a rod, a plate, a housing, a case, a block. However, since the various accessory components are used to install the various constituent elements to the frame 10, the various accessory components may collectively be referred to as the frame 10 except for an exceptional case in an exemplary embodiment of the present invention.

In an exemplary embodiment of the present invention, the moving body 30 may be stacked with at least one unit cell 1, for example, 1-10 unit cells 1, and is installed to be moveable along a predetermined transporting path on the frame 10. The unit cell 1 may be manually stacked on the moving body 30 or may be automatically stacked on the moving body 30 using a gripping device.

Further, to move or drive the moving body 30 along the transporting path, the frame 10 may include a first moving rail 11 installed from a beginning stage of the path to an end stage side of the transporting path along the length direction of the frame 10 and a second moving rail 12 connected to the first moving rail 11 at the beginning stage of the transporting path in the mutual-crossing direction. Particularly, the moving body 30 may be installed to be slid to the first and second moving rail 11 and 12 using the first driving part 31. The first driving part 31 may include a linear motor that is well known in the art The moving body 30 may be moved by the first driving part 31 in the direction crossing the first moving rail 11 along the second moving rail 12 of the beginning stage side of the transporting path. The unit cell 1 may be stacked on the moving body 30 of the beginning stage side of the transporting path. Additionally, when the unit cell 1 is stacked, the moving body 30 may be moved by the first driving part 31 in the direction crossing the first moving rail 11 along the second moving rail 12 and may be moved to the side of the pressurizing unit 50 that will be described in detailed and the end stage side of the transporting path along the first moving rail 11.

Based on the transporting path of the moving body 30, the frame 10 may be divided into a stack section 13, a pressure section 15, and a draw out section 17 (e.g., an extraction section 17). The stack section 13 may be defined as a region where the unit cell 1 is stacked onto the moving body 30 of the beginning stage side of the transporting path. The pressure section 15 may be defined as a region where the unit cell 1 moved from the stack section 13 on the moving body 30 is pressed by the pressurizing unit 50 that will be described later. The extraction section 17 may be defined as a region where the unit cell 1 moved from the pressure section 15 to the end stage side of the transporting path on the moving body 30 is extracted.

Figure 3:
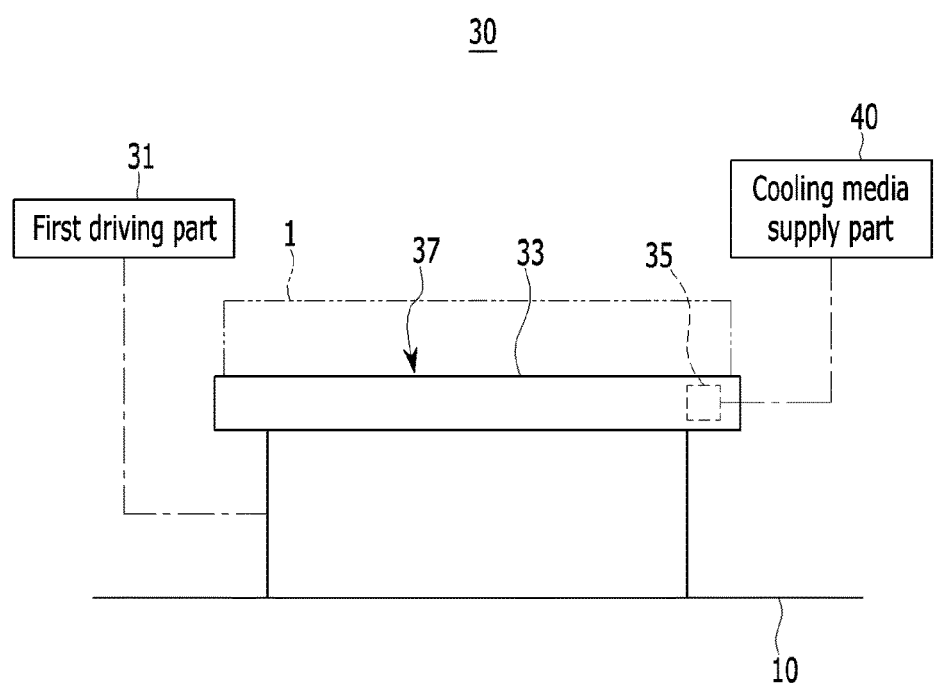
FIG. 3 is a schematic view showing a moving body applied to a performance testing apparatus of a fuel cell according to an exemplary embodiment of the present invention.

Furthermore, in an exemplary embodiment of the present invention, the moving body 30, as shown in FIG. 3, may include a supporting plate 33 configured to support the unit cell 1. The supporting plate 33 may be installed with a cooling agent supply part 40 configured to supply a cooling agent for example, a coolant to the unit cell 1 pressed by the pressurizing unit 50 to be connected. The supporting plate 33 may form a first manifold 35 connected to the cooling agent supply part 40 and configured to supply and discharge the coolant for the unit cell 1. In other words, the supporting plate 33 may include the first manifold 35 and may be provided as a lower end plate 37 configured to support the lower part of the unit cell 1.

Referring to FIG. 1 and FIG. 2, in an exemplary embodiment of the present invention, the pressurizing unit 50 may be configured to press or exert pressure onto the unit cell 1 moved from the stack section 13 of the frame 10 to the pressure section 15 on the moving body 30 by a predetermined pressure and to supply a reaction fluid to the unit cell 1. The pressurizing unit 50 may be disposed at the pressure section 15 of the frame 10 and may include a press body 53 installed to reciprocally move in the vertical direction at the press frame 51 on the frame 10.

In particular, the press frame 51 may be mounted at the pressure section 15 of the frame 10. The press frame 51 may include a lower plate of a square shape mounted to the upper surface of the pressure section 15 of the frame 10, a guide rod 55 mounted upright to each corner of the lower plate in the vertical direction, and an upper plate of the square shape fixedly mounted to the upper part of the guide rod 55. The guide rod 55 may be configured to support the press body 53 and to guide the press body 53 in the vertical direction, the lower part may be coupled to each corner part of the lower plate of the press frame 51, and the upper part may be coupled to each corner part of the upper plate of the press frame 51.

The press body 53 may be configured to substantially press the unit cell 1 moved from the stack section 13 of the frame 10 to the pressure section 15 on the moving body 30 and may be inserted to the guide rod 55 to the press frame 51 and installed to be reciprocally moved in the vertical direction along the guide rod 55 by a forward and backward operation of the press cylinder 57. The press cylinder 57 may be mounted to the upper plate of the press frame 51 and may include an operation rod 59 forward and backward operated in the vertical direction by penetrating the upper plate. The press body 53 may be connected to a front end (lower end) of the operation rod 59.

Figure 4:
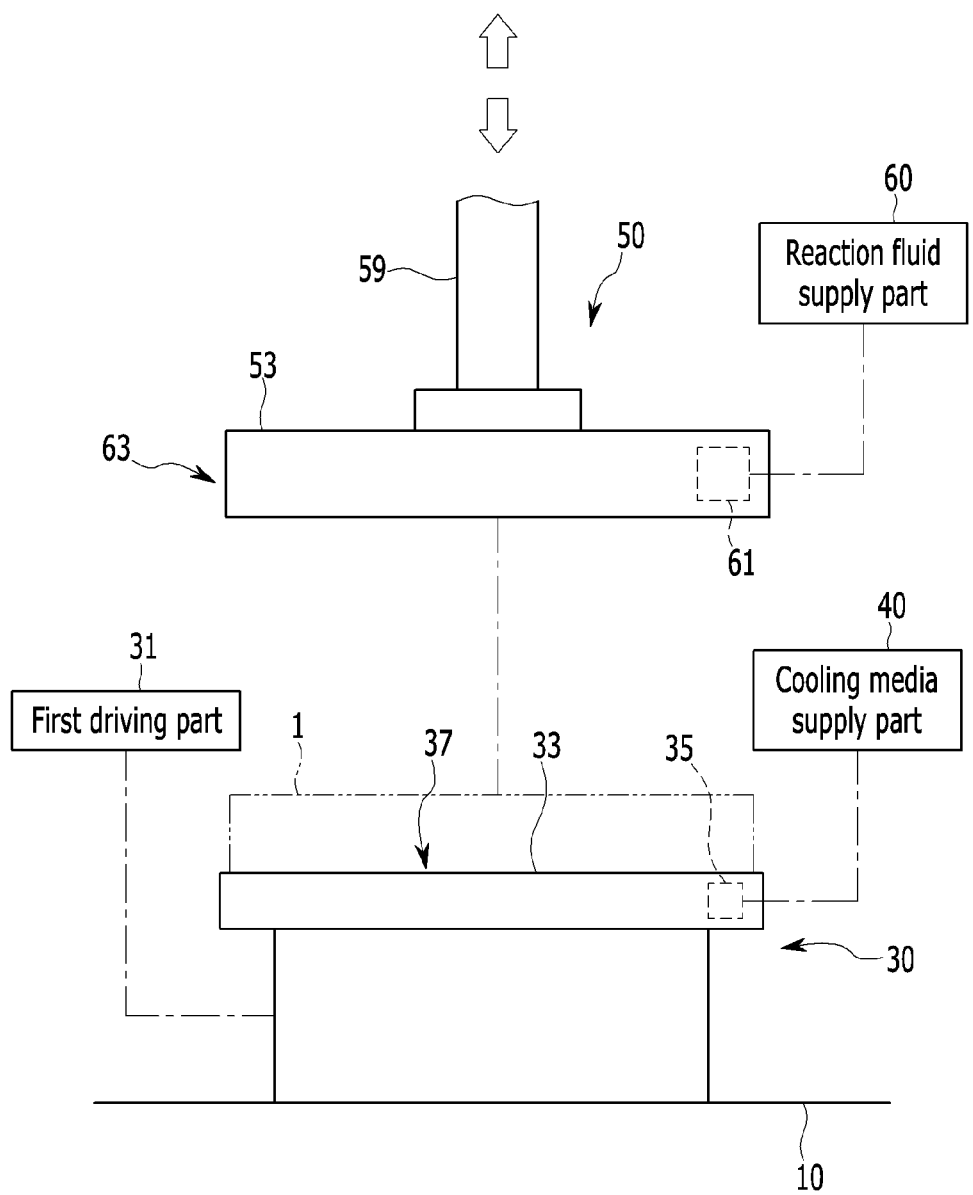
FIG. 4 is a schematic view showing a press body applied to a performance testing apparatus of a fuel cell according to an exemplary embodiment of the present invention.

Furthermore, in an exemplary embodiment of the present invention, the press body 53, as shown in FIG. 4, may include a reaction fluid supply part 60 to be connected to supply the reaction fluid to the unit cell 1 pressed by the press body 53. The reaction fluid supply part 60 may be configured to supply a humidified hydrogen and an air as the reaction fluid to the unit cell 1 using the press body 53. The press body 53 may form a second manifold 61 connected to the reaction fluid supply part 60 and configured to supply and discharge the reaction fluid for the unit cell 1. In other words, the press body 53 may include the second manifold 61 and may be provided as the upper end plate 63 configured to support the upper part of the unit cell 1.

Accordingly, in an exemplary embodiment of the present invention, when the unit cell 1 on the moving body 30 is pressed by the press body 53, the reaction fluid provided from the reaction fluid supply part 60 may be supplied to the unit cell 1 by the second manifold 61 of the press body 53. Accordingly, in the unit cell 1, the electrical energy may be generated by an electrochemical reaction of the reaction fluid and the predetermined voltage may be output through the terminal connection part 70 that will be described later.

Figure 5:
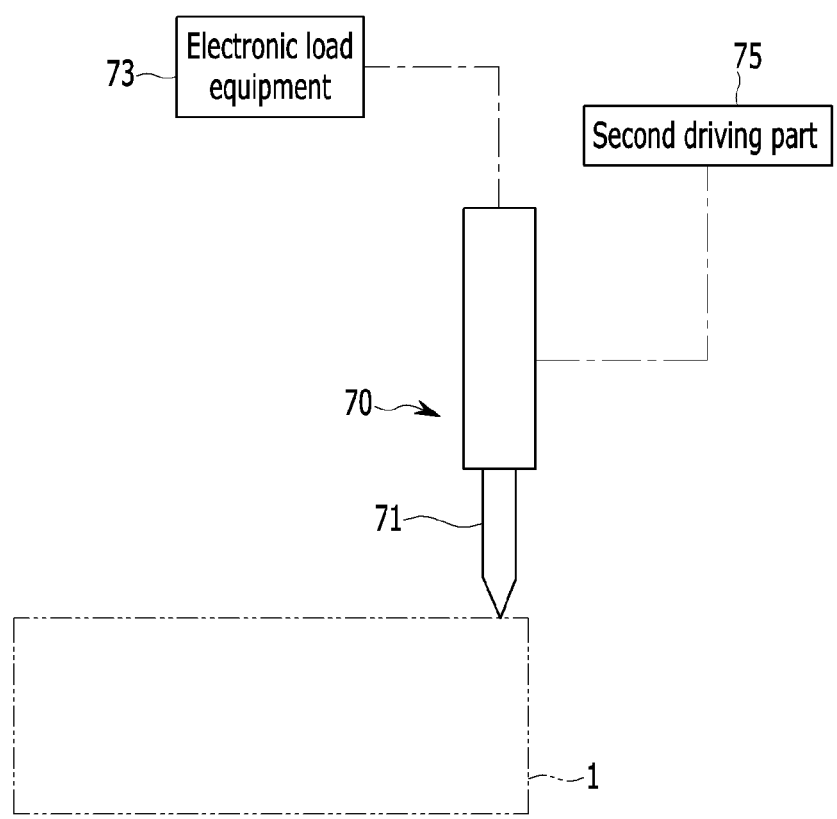
FIG. 5 is a schematic view showing a terminal connection part applied to a performance testing apparatus of a fuel cell according to an exemplary embodiment of the present invention.

Referring to FIG. 1 and FIG. 2, in an exemplary embodiment of the present invention, the terminal connection part 70 may connect an output terminal 71 (referring to FIG. 5) to output the voltage of the unit cell 1 to the unit cell 1. The output terminal 71 may be electrically connected to an electronic load equipment 73 by an output cable. The terminal connection part 70 may be mounted at the pressurizing unit 50 side in the pressure section 15 of the frame 10. The terminal connection part 70, as shown in FIG. 5, may include the output terminal 71 connected to the unit cell 1 and may be installed to be reciprocally moved in the direction crossing the first moving rail 11 as described above by the second driving part 75. The second driving part 75 may include an operation cylinder that is well known in the prior art to reciprocally move the terminal connection part 70 in the direction crossing the first moving rail 11 for the terminal connection part 70 to not interfere with the moving body 30.

Referring to FIG. 2, in an exemplary embodiment of the present invention, the controller 90 may be configured to execute the entire operation for the performance testing apparatus 100 of the fuel cell. For example, the controller 90 may be configured to operate the moving body 30, the pressurizing unit 50, the terminal connection part 70, the coolant supply of the cooling agent supply part 40 for the unit cell 1, and the reaction fluid supply of the reaction fluid supply part 60.

When the unit cell 1 on the moving body 30 is pressed by the press body 53 of the pressurizing unit 50 during a predetermined period of time (e.g., about 1-3 hours), the controller 90 may be configured to adjust the reaction fluid provided from the reaction fluid supply part 60 to be supplied to the unit cell 1 through the press body 53 and the coolant provided from the cooling media supply part 40 to be supplied to the unit cell 1 through the moving body 30.

Figure 6:
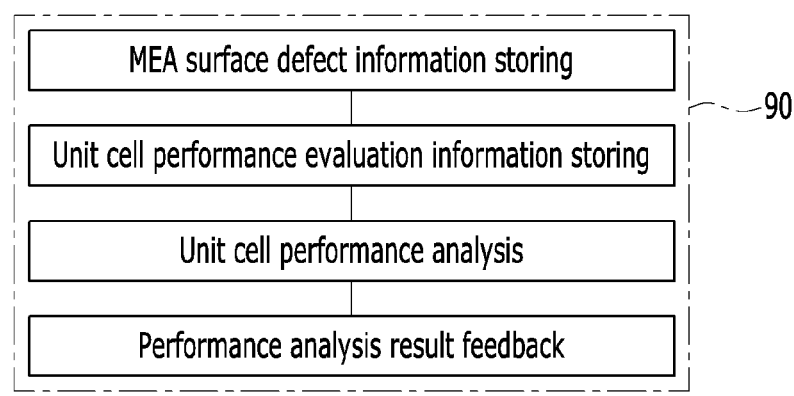
FIG. 6 is a control conception view of a controller applied to a performance testing apparatus of a fuel cell according to an exemplary embodiment of the present invention.

Furthermore, the controller 90 may be configured to apply the output voltage of the unit cell 1 to the electronic load equipment 73 using the terminal connection part 70, may be configured to determine an error existence of the unit cell 1 based on a current-voltage curved line while monitoring the output voltage of the unit cell 1 applied to the electronic load equipment 73, and may be configured to evaluate the performance of the unit cell 1. The controller 90, as shown in FIG. 6, may further be configured to store the performance evaluation information of the unit cell and the surface defect information of the membrane-electrode assembly obtained from the fuel cell manufacturing process, analyze the performance of the unit cell 1 based these information, and feedback the results to the fuel cell manufacturing process.

Moreover, the operation of the fuel cell performance testing apparatus 100 according to an exemplary embodiment of the present invention constituted as above will be described in detail with reference to the previously presented drawings. Firstly, in an exemplary embodiment of the present invention, the unit cell 1 may be configured as a sample of the membrane-electrode assembly produced in each lot of the fuel cell manufacturing process, and the unit cell 1 may be manually or automatically stacked on the moving body 30 in the stack section 13 of the frame 10.

In particular, the membrane-electrode assembly of the unit cell 1 may have a predetermined individual ID by the bar code, and the controller 90 may be configured to recognize the bar code to store the surface defect information of the membrane-electrode assembly obtained from the fuel cell manufacturing process. Additionally, the moving body 30 may be in the state that the moving body 30 is moved by the first driving part 31 in the direction crossing the first moving rail 11 along the second moving rail 12 of the beginning stage side of the transporting path.

As described above, after stacking the unit cell 1 on the moving body 30 in the stack section 13 of the frame 10, in an exemplary embodiment of the present invention, the moving body 30 may be moved by the first driving part 31 in the direction crossing the first moving rail 11 along the second moving rail 12 and moved in the side of the pressure section 15 of the frame 10 along the first moving rail 11. The movement of the moving body 30 may be stopped in the pressure section 15 and the moving body 30 may be positioned under the press body 53 of the pressurizing unit 50.

In particular, according to an exemplary embodiment of the present invention, the operation rod 59 of the press cylinder 57 may be operated forward and the press body 53 of the pressurizing unit 50 may be moved in the downward direction. Accordingly, the press body 53 may be moved in the downward direction along the guide rod 55 of the press frame 51. Thus, the press body 53 may be configured to press the unit cell 1 on the moving body 30. The unit cell 1 may be pressed by the press body 53 between the press body 53 and the supporting plate 33 of the moving body 30.

Thus, when the unit cell 1 is pressed by the press body 53, in an exemplary embodiment of the present invention, the terminal connection part 70 may be moved by the second driving part 75 in the direction crossing the first moving rail 11 and the output terminal 71 of the terminal connection part 70 may be connected to the unit cell 1. Further, the reaction fluid provided from the reaction fluid supply part 60 may be supplied to the unit cell 1 by the second manifold 61 of the press body 53. Accordingly, in the unit cell 1, the electrochemical reaction of the reaction fluid by the activation of the membrane-electrode assembly may be progressed and the heat and the electrical energy may be generated. Particularly, the cooling agent provided from the cooling media supply part 40 may be supplied to the unit cell 1 by the first manifold 35 of the supporting plate 33 of the moving body 30 to cool the unit cell 1 as the coolant.

As described above, when the activation state of the unit cell 1 is maintained and the electrical energy is generated, the output voltage of the unit cell 1 may be applied to the electronic load equipment 73 by the terminal connection part 70. Accordingly, while monitoring the output voltage of the unit cell 1 applied to the electronic load equipment 73, the controller 90 may be configured to determine the abnormalities of the unit cell 1 based on the current-voltage curved line and evaluate the performance of the unit cell 1.

Additionally, when the surface defect information of the membrane-electrode assembly is stored, the controller 90 may be configured to store the performance evaluation information of the unit cell 1. Accordingly, the controller 90 may be configured to analyze the performance of the unit cell 1 based on the surface defect information of the membrane-electrode assembly and the performance evaluation information of the unit cell 1 and feedback the analysis result to the fuel cell manufacturing process. In order words, in an exemplary embodiment of the present invention, the performance evaluation information of the unit cell 1 may be compared with the predetermined reference performance based on the surface defect information of the membrane-electrode assembly obtained from the fuel cell manufacturing process to analyze the performance of the unit cell 1.

For example, in an exemplary embodiment of the present invention, when the performance evaluation information of the unit cell 1 satisfies the reference performance based on the surface defect information of the membrane-electrode assembly, the performance analysis result of the unit cell 1 according thereto fed back to the fuel cell manufacturing process. In particular, a following process(stack assembly process) of the membrane-electrode assembly produced in the fuel cell manufacturing process may be progressed.

Furthermore, when the performance evaluation information of the unit cell 1 does not satisfy the reference performance based on the surface defect information of the membrane-electrode assembly, the performance analysis result of the unit cell 1 may be fed back to the fuel cell manufacturing process. In particular, the following process (the stack assembly process) of the membrane-electrode assembly produced in the fuel cell manufacturing process may not be progressed and the membrane-electrode assembly may be discarded.

In other words, in an exemplary embodiment of the present invention, the defect determination reference of the membrane-electrode assembly in the fuel cell manufacturing process may be derived as the performance analysis result of the unit cell 1 based on the surface defect information of the membrane-electrode assembly obtained in the fuel cell manufacturing process and the performance evaluation information of the unit cell 1. Further, after the procedure described above, the supply of the reaction fluid and the coolant for the unit cell 1 may be blocked and the press body 53 of the pressurizing unit 50 and the terminal connection part 70 may be moved to an original position. In particular, the moving body 30 may be moved by the first driving part 31 to the extraction section 17 of the frame 10 along the first moving rail 11. Thus, the unit cell 1 on the moving body 30 may be manually or automatically extracted from the extraction section 17.

According to the performance testing apparatus 100 of the fuel cell according to an exemplary embodiment of the present invention as described so far, before configuring the membrane-electrode assembly produced in each lot of the fuel cell manufacturing process as the unit cell 1 and assembling the unit cell 1 as the stack, since the performance of the membrane-electrode assembly is sampling and tested, the time aspect and the cost aspect are more efficient, and the time and the cost may be reduced.

Furthermore, in an exemplary embodiment of the present invention, the performance of the unit cell 1 may be analyzed in conjunction with the surface defect information of the membrane-electrode assembly obtained from the fuel cell manufacturing process and the analysis result may be fed back to the fuel cell manufacturing process such that the quality testing reference of the membrane-electrode assembly in the fuel cell manufacturing process may be obtained.

While this invention has been described in connection with what is presently considered to be exemplary embodiments, it is to be understood that the invention is not limited to the disclosed exemplary embodiments, but, on the contrary, is intended to cover various modifications and equivalent arrangements included within the spirit and scope of the appended claims.

DESCRIPTION OF SYMBOLS

1 . . . unit cell
10 . . . frame
11 . . . first moving rail
12 . . . second moving rail
13 . . . stack section
15 . . . pressure section
17 . . . extraction section
30 . . . moving body
31 . . . first driving part
33 . . . supporting plate
35 . . . first manifold
37 . . . lower end plate
40 . . . cooling agent supply part
50 . . . pressurizing unit
51 . . . press frame
53 . . . press body
55 . . . guide rod
57 . . . press cylinder
59 . . . operation rod
60 . . . reaction fluid supply part
61 . . . second manifold
63 . . . upper end plate
70 . . . terminal connection part
71 . . . output terminal
73 . . . electronic load equipment
75 . . . second driving part
90 . . . controller

What is claimed is:

1. A performance testing apparatus of a fuel cell, comprising:
a moving body configured to stack at least one unit cell and installed to be movable along a predetermined transporting path on a frame;
a pressurizing unit mounted to the frame, configured to press the unit cell on the moving body moved from a beginning stage side of the transporting path, and supply a reaction fluid to the unit cell; and
a terminal connection part mounted to the pressurizing unit side the frame and that connects a terminal to output a voltage of the unit cell to the unit cell,
wherein the pressurizing unit includes a press body mounted to a press frame on the frame to be movable in vertical direction and configured to press the unit cell stacked on the moving body.

2. The performance testing apparatus of the fuel cell of claim 1, further comprising:
a controller configured to monitor an output voltage of the unit cell output by the terminal connection part and evaluate the performance of the unit cell.

3. The performance testing apparatus of the fuel cell of claim 2, wherein the controller is configured to supply a reaction fluid to the unit cell using the pressurizing unit when the unit cell is pressed by the pressurizing unit during a predetermined period of time.

4. The performance testing apparatus of the fuel cell of claim 1, further comprising:
a reaction fluid supply part installed to be connected to the pressurizing unit and configured to supply the reaction fluid to the unit cell using the pressurizing unit.

5. The performance testing apparatus of the fuel cell of claim 4, further comprising:
a cooling agent supply part installed to be connected to the moving body and configured to supply a cooling agent to the unit cell through the moving body.

6. The performance testing apparatus of the fuel cell of claim 1, wherein the frame is divided into, based on the transporting path:
a stack section as a region where the unit cell is stacked to the moving body of the beginning stage side of the transporting path,
a pressure section as a region where the unit cell on the moving body moved from the stack section is pressed by the pressurizing unit, and
an extraction section as a region where the unit cell on the moving body moved to the end stage side of the transporting path from the pressure section is extracted.

7. The performance testing apparatus of the fuel cell of claim 1, wherein the frame includes:
a first moving rail installed from the beginning stage of the transporting path to the end stage, and
a second moving rail connected to the first moving rail of the beginning stage side of the transporting path to be mutually crossed.

8. The performance testing apparatus of the fuel cell of claim 7, wherein the moving body is installed to be movable by a first driving part along the first and second moving rails.

9. The performance testing apparatus of the fuel cell of claim 1, wherein the press body is installed with a reaction fluid supply part configured to supply the reaction fluid to the unit cell to be connected.

10. The performance testing apparatus of the fuel cell of claim 9, wherein the press body is provided as an upper end plate connected to the reaction fluid supply part and includes a manifold configured to supply and discharge the reaction fluid for the unit cell.

11. The performance testing apparatus of the fuel cell of claim 1, wherein the moving body includes a supporting plate configured to support the unit cell, and the supporting plate is installed with a cooling agent supply part configured to supply a cooling agent to the unit cell to be connected.

12. The performance testing apparatus of the fuel cell of claim 11, wherein the supporting plate is provided as a lower end plate connected to the cooling agent supply part and includes a manifold configured to supply and discharge the cooling agent for the unit cell.

13. The performance testing apparatus of the fuel cell of claim 1, wherein the press body is installed to be connected to an operation rod of a press cylinder provided in the press frame.

14. The performance testing apparatus of the fuel cell of claim 13, wherein the press frame is installed with a plurality of guide rods configured to support the press body to be guided in the vertical direction.

15. The performance testing apparatus of the fuel cell of claim 1, wherein the terminal connection part is installed to be reciprocally moved by a second driving part in the direction crossing the transporting path.

16. A performance testing apparatus of the fuel cell maintaining an activation of a unit cell sampled in each lot of a fuel cell manufacturing process and evaluating a performance of the unit cell, comprising:
a moving body configured to stack at least one unit cell and installed to be movable along a predetermined transporting path on a frame;
a pressurizing unit installed to the frame, configured to press the unit cell on the moving body moved from a beginning stage side of the transporting path, and supply a reaction fluid to the unit cell;
a terminal connection part mounted to the pressurizing unit side the frame and that connects a terminal to output a voltage of the unit cell to the unit cell; and a controller configured to monitor an output voltage of the unit cell output by the terminal connection part and evaluate the performance of the unit cell, wherein the controller is configured to store a performance evaluation information of the unit cell and a surface defect information of a membrane-electrode assembly obtained from the fuel cell manufacturing process, analyze the performance of the unit cell based on the information, and feedback the analysis result to the fuel cell manufacturing process, and wherein the pressurizing unit includes a press body mounted to a press frame on the frame to be movable in vertical direction and configured to press the unit cell stacked on the moving body.

17. The performance testing apparatus of the fuel cell of claim 16, wherein the performance testing apparatus of the fuel cell is configured to:

stack at least one unit cell on the moving body of the beginning stage side of the transporting path;

move the unit cell to the pressurizing unit side using the moving body;

press the unit cell using the pressurizing unit and supply the reaction fluid to the unit cell; and connect a voltage output terminal to the unit cell using the terminal connection part.

18. The performance testing apparatus of the fuel cell of claim 17, wherein the performance testing apparatus of the fuel cell is configured to:

apply the output voltage of the unit cell to the electronic load equipment through the voltage output terminal; and monitor the output voltage of the unit cell applied to the electronic load equipment using the controller.

19. The performance testing apparatus of the fuel cell of claim 18, wherein the performance testing apparatus of the fuel cell is configured to:

release the pressure of the unit cell of the pressurizing unit and move the unit cell to the end stage side of the transporting path using the moving body.

* * * * *